(12) United States Patent
Raychaudhuri

(10) Patent No.: US 11,447,082 B2
(45) Date of Patent: Sep. 20, 2022

(54) ADDITIVE MANUFACTURING TECHNIQUES FOR PRODUCING A NETWORK OF CONDUCTIVE PATHWAYS ON A SUBSTRATE

(71) Applicant: YAZAKI CORPORATION, Tokyo (JP)

(72) Inventor: Satyabrata Raychaudhuri, Camarillo, CA (US)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/909,901

(22) Filed: Jun. 23, 2020

(65) Prior Publication Data

US 2020/0324717 A1 Oct. 15, 2020

Related U.S. Application Data

(63) Continuation of application No. PCT/US2019/065027, filed on Dec. 6, 2019.
(Continued)

(51) Int. Cl.
*H01B 1/22* (2006.01)
*B60R 16/027* (2006.01)
*B60R 16/033* (2006.01)
*B60R 16/037* (2006.01)
*H01L 25/065* (2006.01)
*B33Y 80/00* (2015.01)

(52) U.S. Cl.
CPC .......... *B60R 16/027* (2013.01); *B60R 16/033* (2013.01); *B60R 16/037* (2013.01); *H01B 1/22* (2013.01); *B33Y 80/00* (2014.12)

(58) Field of Classification Search
CPC .............. H05K 7/02; H01R 33/00; B60J 5/04
See application file for complete search history.

(56) References Cited

U.S. PATENT DOCUMENTS 3,293,353 A * 12/1966 Hendriks ................. H01R 9/00
174/36
3,525,536 A * 8/1970 Pruneski ............... B60R 16/027
280/731
(Continued)

FOREIGN PATENT DOCUMENTS

WO    2017222066 A1    12/2017

OTHER PUBLICATIONS

International Search Report and Written Opinion dated Apr. 21, 2020 from corresponding International Application No. PCT/US2019/065027.

*Primary Examiner* — William H. Mayo, III
*Assistant Examiner* — Krystal Robinson
(74) *Attorney, Agent, or Firm* — Perkins Coie LLP; Viola T. Kung; Alberto Araiza

(57) ABSTRACT

The disclosed embodiments include an automobile panel that can include a polymer substrate, a network of conductive pathways, and connectors coupled to ends of the network of conductive pathways. The network of conductive pathways can include conductive material disposed in cavities forming a network of channels in the polymer substrate. The conductive material at least partially encapsulates by the polymer substrate. The connectors are connectable to automotive electronic devices thereby forming electrical circuits that include the network of conductive pathways and the automotive electronics.

25 Claims, 10 Drawing Sheets

Related U.S. Application Data

(60) Provisional application No. 62/780,089, filed on Dec. 14, 2018.

(56) References Cited

U.S. PATENT DOCUMENTS

| | | | | |
|---|---|---|---|---|
| 3,556,239 | A * | 1/1971 | Spahn | B60L 50/60 180/65.25 |
| 3,600,800 | A * | 8/1971 | Akachi | G11C 5/04 29/604 |
| 4,486,373 | A * | 12/1984 | Kurauchi | B29B 9/06 264/137 |
| 4,831,278 | A * | 5/1989 | Ueda | B60R 16/0207 174/71 R |
| 4,945,677 | A * | 8/1990 | Kramer | B60J 5/06 296/155 |
| 5,082,310 | A * | 1/1992 | Bauer | B26D 3/085 280/728.3 |
| 5,129,695 | A * | 7/1992 | Norman, II | B60J 11/06 280/770 |
| 5,356,177 | A * | 10/1994 | Weller | B60R 21/0428 280/751 |
| 5,712,764 | A * | 1/1998 | Baker | B60R 16/0239 180/90 |
| 5,805,402 | A | 9/1998 | Maue et al. | |
| 6,048,020 | A * | 4/2000 | Gronowicz | B60R 16/0238 296/70 |
| 6,092,854 | A * | 7/2000 | Campbell | B60R 16/0215 296/70 |
| 6,142,556 | A * | 11/2000 | Tanaka | B60R 16/0207 174/72 A |
| 6,428,081 | B1 * | 8/2002 | Williams, Jr. | B29C 45/1671 296/146.1 |
| 6,429,544 | B1 * | 8/2002 | Sasaki | B60N 2/0224 307/10.1 |
| 6,494,522 | B1 * | 12/2002 | Drewniok | B60R 16/0207 296/146.7 |
| 9,241,415 | B2 * | 1/2016 | Quinn | H01B 7/0045 |
| 9,874,047 | B2 * | 1/2018 | Milne | E05B 81/54 |
| 10,017,133 | B2 * | 7/2018 | Tsunoda | H05K 1/0265 |
| 10,023,134 | B2 * | 7/2018 | Osada | B60R 13/0243 |
| 2002/0011786 | A1 | 1/2002 | Murasko et al. | |
| 2003/0082380 | A1 * | 5/2003 | Hager | G02B 6/04 428/375 |
| 2004/0049988 | A1 * | 3/2004 | Reul | B60J 5/0416 49/502 |
| 2009/0305534 | A1 * | 12/2009 | Tanaka | H01R 24/60 439/108 |
| 2013/0114220 | A1 | 5/2013 | Broughton et al. | |
| 2013/0292159 | A1 * | 11/2013 | Gotou | H02G 3/305 174/250 |
| 2014/0268604 | A1 * | 9/2014 | Wicker | B29C 70/885 361/760 |
| 2016/0329305 | A1 * | 11/2016 | Chiao | H01L 25/0657 |
| 2017/0151916 | A1 | 6/2017 | Tsunoda et al. | |
| 2017/0208712 | A1 * | 7/2017 | Kodama | G01R 31/006 |
| 2018/0185962 | A1 * | 7/2018 | Masse | C22C 21/02 |

* cited by examiner

ADDITIVE MANUFACTURING TECHNIQUES FOR PRODUCING A NETWORK OF CONDUCTIVE PATHWAYS ON A SUBSTRATE

CROSS REFERENCE TO RELATED APPLICATIONS

This application is a continuation of PCT Application No. PCT/US2019/065027, filed Dec. 6, 2019, which claims priority to U.S. Provisional Patent Application No. 62/780,089, filed Dec. 14, 2018. The contents of the above applications are incorporated herein by reference.

TECHNICAL FIELD

The disclosed teachings generally relate to additive manufacturing (AM) techniques for forming conductive pathways on a substrate. The disclosed teachings more particularly relate to utilizing AM equipment and techniques to embed a network of conductive pathways in an automobile panel that can interconnect automobile electrical components.

BACKGROUND

A wire harness is an assembly of electrical cables or wires that can transmit signals or electrical power. The cables are bound together by straps, cable ties, cable lacing, sleeves, electrical tape, conduit, a weave of string, or combinations thereof. Wire harnesses are commonly used in automobile connectivity systems, as well as construction machinery because wire harnesses provide several advantages over loose wires and cables.

FIG. 1A illustrates an example of a conventional wire harness for an automobile. As shown, the wire harness includes numerous wires that would stretch over several kilometers if fully extended. By binding the wires and cables into a wire harness, the wires and cables can be better secured against the adverse effects of vibrations, abrasions, and moisture. By constricting the wires into a bundle, usage of space is optimized, and the risk of an electrical short is reduced.

FIG. 1B depicts an example of how the automobile wire harness of FIG. 1A is installed in an automobile. A human installer has only one harness to install as opposed to installing each wire or cable in the harness, which reduces installation time and standardizes the installation process. Binding the wires into a flame-retardant sleeve also lowers the risk of electrical fires.

A wire harness is usually designed according to geometric and electrical specifications that are provided to human operators who manually assemble a wire harness and install the assembled wire harness in an automobile. For example, a human operator usually first cuts wires to a desired length by using a special wire-cutting machine. After this, the ends of the wires are stripped to expose the metal of the wires, which are fitted with any required terminals or connector housings. The cables are assembled and clamped together on a special workbench or onto a pin board to form the wire harness. After fitting any protective sleeves, conduit, or extruded yarn, the harness can be fitted directly in an automobile.

Despite increasing automation in manufacturing, manual human manufacturing continues to be the primary method of wire harness production in general, due to the many different processes such as routing wires through sleeves, taping wires to form branches, crimping terminals onto wires, inserting one sleeve into another, fastening strands with tape, clamps or cable ties, etc. It is difficult to automate these processes, with suppliers still using manual means of production. Thus, manual production remains preferred because an automated process that is more cost effective does not exist.

SUMMARY

Introduced here is at least one method for fabricating a connectivity panel, a system for fabricating the connectivity panel, and the connectivity panel. For example, an automobile connectivity panel can include a substrate composed of an electrically insulating material (e.g., polymer, ceramic) that has an electrically conductive pathway with a connectable end. The electrically conductive material ("conductive material") can be disposed in a cavity of the substrate. The cavity can be formed on a surface of the substrate as a channel that at least partially encapsulates the conductive material.

The connectable end can connect the conductive pathway to an electronic component (e.g., automotive electronic device). In some embodiments, a sealant layer is applied on an underside of an automobile panel, where the conductive pathway is disposed between the substrate and the sealant layer.

The at least one method of fabricating the connectivity panel includes ejecting, by an ejection nozzle, conductive material along a first path to a polymer substrate, and aiming, by a laser light emitter, a laser light at a target location of the first path to cause heating of the conductive material to a temperature that softens the conductive material. The target location is sufficiently distant from the polymer substrate such that the laser light does not heat the polymer substrate. In addition, the softened conductive material sufficiently cools to harden on the polymer substrate. As such, this configuration avoids or mitigates damage (e.g., undesired vaporizing, tearing, destroying) to the polymer substrate that could be caused by the laser light or overheated softened conductive material. The method further includes maneuvering, by a mechanical mechanism, the ejection nozzle and/or a platform on which the polymer substrate is placed to draw a network of conductive pathways with the conductive material on the polymer substrate.

The at least one system is an additive manufacturing system that includes a platform, an ejection nozzle, a laser emitter, and a mechanical mechanism that enables maneuvering the platform and/or ejection nozzle to draw a network of conductive pathways on the polymer substrate. The platform is configured to receive a substrate, and the ejection nozzle is positioned to eject material along a first path towards the platform. The laser emitter is positioned to emit laser light along a second path that intersects the first path. The second path intersects the first path at a target location sufficiently distant from the platform to heat ejected material without heating a substrate on the platform.

Other aspects of the disclosed embodiments will be apparent from the accompanying figures and detailed description.

This Summary is provided to introduce a selection of concepts in a simplified form that is further explained below in the Detailed Description. This Summary is not intended to identify key features or essential features of the claimed subject matter, nor is it intended to be used to limit the scope of the claimed subject matter.

BRIEF DESCRIPTION OF THE DRAWINGS

One or more embodiments of the present disclosure are illustrated by way of example and not limitation in the figures of the accompanying drawings, in which like references indicate similar elements.

DETAILED DESCRIPTION

Figure 1A:
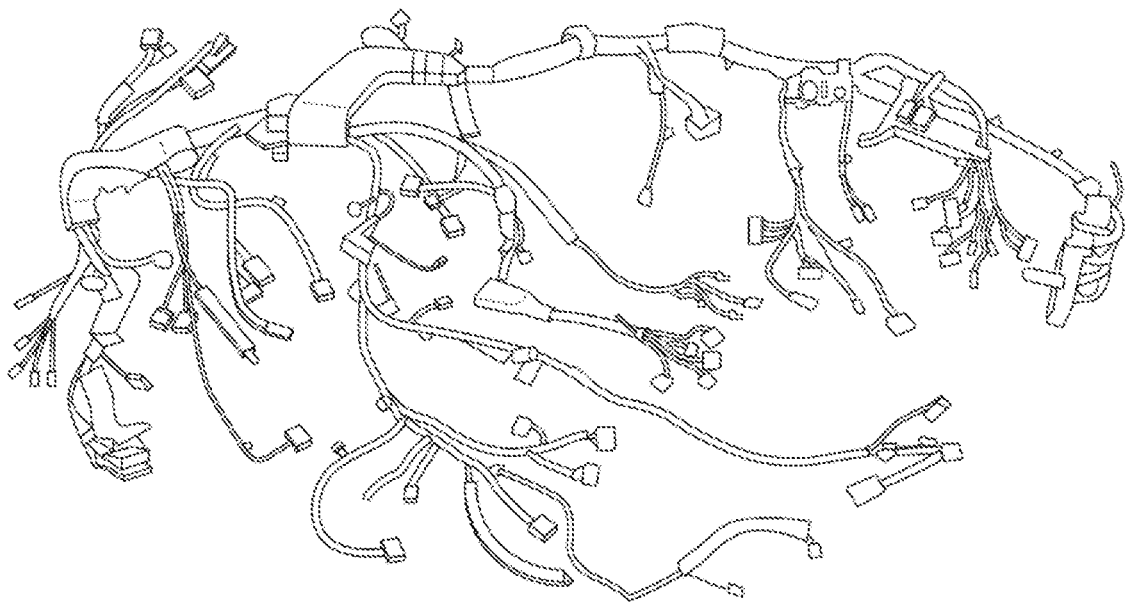
FIG. 1A illustrates an example of a conventional wire harness for an automobile.
Figure 1B:
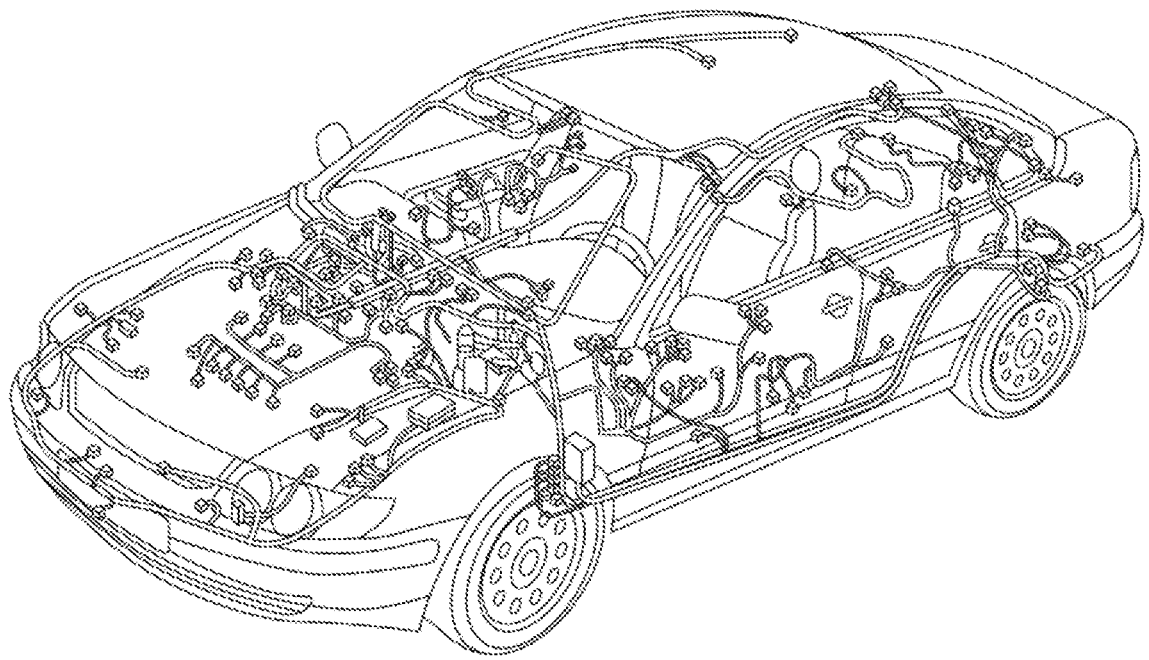
FIG. 1B illustrates an example of the wire harness of FIG. 1A installed in an automobile.

The embodiments set forth below represent the necessary information to enable those skilled in the art to practice the embodiments and illustrate the best mode of practicing the embodiments. Upon reading the following description in light of the accompanying figures, those skilled in the art will understand the concepts of the disclosure and will recognize applications of these concepts that are not particularly addressed herein. It should be understood that these concepts and applications fall within the scope of the disclosure and the accompanying claims.

The purpose of terminology used herein is only for describing embodiments and is not intended to limit the scope of the disclosure. Where context permits, words using singular or plural form may also include the plural or singular form, respectively.

As used herein, unless specifically stated otherwise, terms such as "processing," "computing," "calculating," "determining," "displaying," "generating" or the like, refer to actions and processes of a computer or similar electronic computing device that manipulates and transforms data represented as physical (electronic) quantities within the computer's memory or registers into other data similarly represented as physical quantities within the computer's memory, registers, or other such storage medium, transmission, or display devices.

As used herein, the terms "connected," "coupled," or variants thereof, mean any connection or coupling, either direct or indirect, between two or more elements. The coupling or connection between the elements can be physical, logical, or a combination thereof.

As used herein, the term "damage," in the context of changes to a substrate that are caused by the laser light or heated conductive material, may refer to an unintended or undesired change that reduces or eliminates the functionality or usefulness of the substrate to, for example, secure a network of conductive pathways.

As used herein, the term "conductive material," "conductive pathway," or the like, refer to an electrically conductive material or pathway unless clearly stated otherwise. An electrically conductive material may have other conductive properties such as thermal conductivity.

At least some of the disclosed embodiments relate to wire-feed additive manufacturing (AM) equipment and techniques to produce electrical circuits on a substrate. Specifically, a connectivity panel is formed of a lightweight and flexible or rigid substrate that has a network of conductive pathways, which are connectable to electronic components to thereby form electrical circuits. The connectivity panel can be manufactured using automated processes and the resulting connectivity panel can conform to various geometrical structures on which it is installed. As such, embodiments of the disclosed connectivity panel can replace conventional wire harnesses. The automated manufacturing of a connectivity panel is more cost effective and has improved properties (e.g., lightweight, flexible) compared to conventional wire harnesses.

The disclosed embodiments also overcome the drawbacks of using existing wire-feed AM techniques in certain applications. In some embodiments, a polymer substrate is desired because the resulting connectivity panel would be lightweight and flexible to accommodate the geometric structure of automobile bodies and reduce weight that affects the performance of the automobile. However, polymer materials have relatively low heat resistance and existing wire-feed AM material is typically heated to a molten state with a temperature that would vaporize the polymer substrate. In a standard wire-feed AM process, a laser is aimed at the contact point of the wire and the surface on which the wire is to be deposited, which in typical applications is a previously-deposited layer of the same metal or alloy. If this same standard process was used with a polymer substrate, the laser would damage the polymer.

The disclosed embodiments overcome the aforementioned drawbacks of conventional wire harnesses and solve the problems of conventional wire-feed AM processes to produce a network of conductive pathways on or in a substrate of a connectivity panel. For example, in some embodiments, the aim of an electromagnetic (EM) energy source (e.g., laser) is located at a point on a feed wire that is slightly above the surface of the substrate to avoid vaporizing the polymer substrate by raising its temperature above a melting point. The aiming point and other parameters are fine-tuned such that damage to the polymer substrate is avoided while the deposition of the molten or softened conductive material can still be precisely controlled to form conductive pathways.

Although the disclosure primarily refers to manufacturing a connectivity panel that can replace conventional automobile wire harnesses, the disclosed embodiments are not so limited. For example, the disclosed embodiments broadly include techniques for producing a network of conductive pathways on any type of flexible or rigid material for any application. Specifically, the disclosed embodiments improve over conventional AM techniques to readily "print" heated conductive materials without damaging substrates that have lower melting point temperatures compared to the heated conductive materials.

"Additive manufacturing" (AM) refers to material being added together. Unlike conventional machining processes that remove material (i.e., subtractive manufacturing), AM builds a 3D object based on a computer-aided design (CAD) model or an additive manufacturing file (AMF), usually by successively adding material layer-by-layer. A well-known example of AM is 3D printing, which can involve ejecting a binder onto a powder bed in a layer-by-layer process to form a 3D structure. In a broader sense, AM encompasses any of various processes in which material is joined or solidified under computer control to create a 3D object with material such as liquid molecules or powder grains being fused together. The objects can have almost any shape or geometry and are typically produced using digital model data from a 3D model or another electronic data source and usually in sequential layers. In some instances, subtractive manufacturing complements AM as a removal method for an AM produced structure.

Although manufacturing techniques such as injection molding are typically less expensive for producing large quantities of polymer products, AM techniques are faster, more flexible, and less expensive for producing complex structures. Some general principals of AM include modeling, printing, and finishing. A 3D model of object may be created with CAD software or other computer-based techniques. Before printing the object from a corresponding instruction file, the file is examined for errors by an electronic controller and repaired to produce a 3D object. The instruction file could be processed by software that converts the model into a series of thin layers and produces code files containing instructions tailored to a protocol used by a specific AM equipment. The code files are rendered with AM client software, which loads the code, and uses it to instruct the AM equipment during the AM process (e.g., 3D printing process).

The resolution of an AM rendering process refers to layer thickness and X-Y resolution in dots per inch (dpi) or micrometers (μm). Typical layer thickness is around 100 μm (250 DPI), although some AM equipment can render layers as thin as 16 μm (1,600 DPI). X-Y resolution is comparable to that of laser printers. The particles (3D dots) are around 50 to 100 μm (510 to 250 DPI) in diameter. For that resolution, specifying a mesh resolution of 0.01-0.03 millimeter (mm) and a chord length 0.016 mm generates an optimal output file for a given model input file. The standard available resolution is sufficient for many applications; however, printing an oversized version of a desired object in standard resolution and then removing material with a higher-resolution subtractive process can achieve greater precision.

A consumer grade AM system can print a 3D model over a span of several hours or days, depending on the printing method and the size and complexity of the 3D model. More sophisticated AM systems can reduce this time to a few hours, although this varies widely depending on the type of AM machine used and the size and number of 3D models being produced simultaneously. An AM technique can use multiple types of materials to render structures. As a result, a 3D model can be printed in multiple materials and color combinations simultaneously.

There are a variety of AM methods and AM equipment available. A central difference between AM methods is the way layers of materials are deposited and the types of materials that are used. Each method has its own advantages and drawbacks, which is why vendors offer a choice of materials and substrates to render a 3D object. Some vendors use standard, off-the-shelf techniques to produce durable prototypes. Considerations in choosing an AM machine include speed, costs of the AM machine, of the printed prototype, choice and cost of the materials, and color capabilities. Examples of categories of AM processes include binder jetting, directed energy deposition, material extrusion, material jetting, powder bed fusion, sheet lamination, and vat photopolymerization.

Two broad categories of AM processes include powder-based AM and wire-feed AM. An example of powder-based AM process is selective laser sintering (SLS), which can use metals or polymers to build 3D structures. Selective laser melting does not use sintering for the fusion of powder granules but will completely melt a powder using a high-energy laser to create fully dense materials in a layer-wise method that has mechanical properties similar to those of conventional manufactured metals. Electron beam melting (EBM) is a similar type of AM technology for metal parts (e.g. titanium alloys). EBM manufactures parts by melting metal powder layer-by-layer with an electron beam in a vacuum. Another method consists of an inkjet 3D printing system, which creates the model one layer at a time by spreading a layer of powder (e.g., plaster, resins) and printing a binder in the cross-section of the part using an inkjet-like process. With laminated object manufacturing, thin layers are cut to shape and joined together.

A wire-feed AM process involves melting or softening material to deposit layers on a substrate or other layers to produce a 3D structure. In fused filament fabrication (also known as fused deposition modeling (FDM)), a 3D model is rendered by extruding small beads or streams of material which harden to form layers. A filament of thermoplastic, metal wire, or other material is fed into an extrusion nozzle head, which heats the material and turns the flow on/off. Another technique fuses parts of a layer and then moves upward in the working area, adding another layer of granules and repeating the process until the object is built-up. This process uses the unfused media to support overhangs and thin walls in the part being produced, which reduces the need for temporary auxiliary supports for the piece. FDM has expanded to print directly from pellets to avoid conversion of the pellets to a filament. This process is called fused particle fabrication (FPF) (or fused granular fabrication (FGF)) and has the potential to use more recycled materials.

Other AM methods involve curing liquid materials using different technologies such as stereolithography. Photopolymerization is used in stereolithography to produce a solid part from a liquid material. Inkjet printer systems may spray photopolymer materials onto a build tray in ultra-thin layers until the structure is complete. Each photopolymer layer is cured with UV light after it is jetted, producing fully cured models that can be handled and used immediately, without post-curing. Ultra-small features can be made with the 3D micro-fabrication technique used in multiphoton photopolymerization. Due to the nonlinear nature of photo-excitation, the gel is cured to a solid only in the places where the laser was focused while the remaining gel is then washed away. Feature sizes of under 100 nm are readily produced, as well as complex structures with moving and interlocked parts. Yet another approach uses a synthetic resin that is solidified using LEDs.

In mask-image-projection-based stereolithography, a 3D digital model is sliced by a set of horizontal planes. Each slice is converted into a two-dimensional mask image. The mask image is then projected onto a photocurable liquid resin surface and light is projected onto the resin to cure it in the shape of the layer. Continuous liquid interface production begins with a pool of liquid photopolymer resin. Part of the pool bottom is transparent to ultraviolet light, which causes the resin to solidify. The object rises slowly enough to allow resin to flow underneath and maintain contact with the bottom of the object. In powder-fed directed-energy deposition, a high-power laser is used to melt metal powder supplied to the focus of the laser beam. The powder fed directed energy process is similar to SLS, but the metal powder is applied only where material is being added to the part at that moment.

The AM systems currently on the market broadly range in price and are employed in industries including aerospace, architecture, automotive, defense, and medical industries. Therefore, AM can involve numerous different methods and equipment to create almost any 3D object. However, a person skilled in the art would understand that there are many limitations and drawbacks to existing AM processes and resulting products. For example, AM processes cannot readily produce objects including components formed of different materials such as a structure with distinct metal and polymer components. This results in part because of existing configurations of available AM equipment. For example, existing wire-feed AM techniques use a laser to melt a metal wire in contact with a substrate on which the metal is being deposited.

This ensures precise deposition of a material at a desired location. A drawback, however, is that the surface on which the metal is being deposited must have a melting point temperature that is higher than the melting point of the metal to avoid melting or vaporizing the substrate. Therefore, AM techniques do not necessarily offer a straightforward application to produce any 3D object for any purpose.

The disclosed embodiments solve the aforementioned drawbacks to utilize wire-feed AM techniques to produce electrical circuits embedded in a substrate. A resulting connectivity panel can have a network of conductive pathways while remaining lightweight and potentially flexible. The conductive pathways are connectable to electronic components to thereby form electrical circuits. Hence, the connectivity panel can replace conventional wire harnesses for automobiles. The automated manufacturing of a connectivity panel is more cost effective compared to the cost of laborious human effort required to manufacture conventional wire harnesses for automobiles. In addition, the connectivity panel is beneficially lightweight and flexible compared to conventional wire harnesses.

Figure 2:
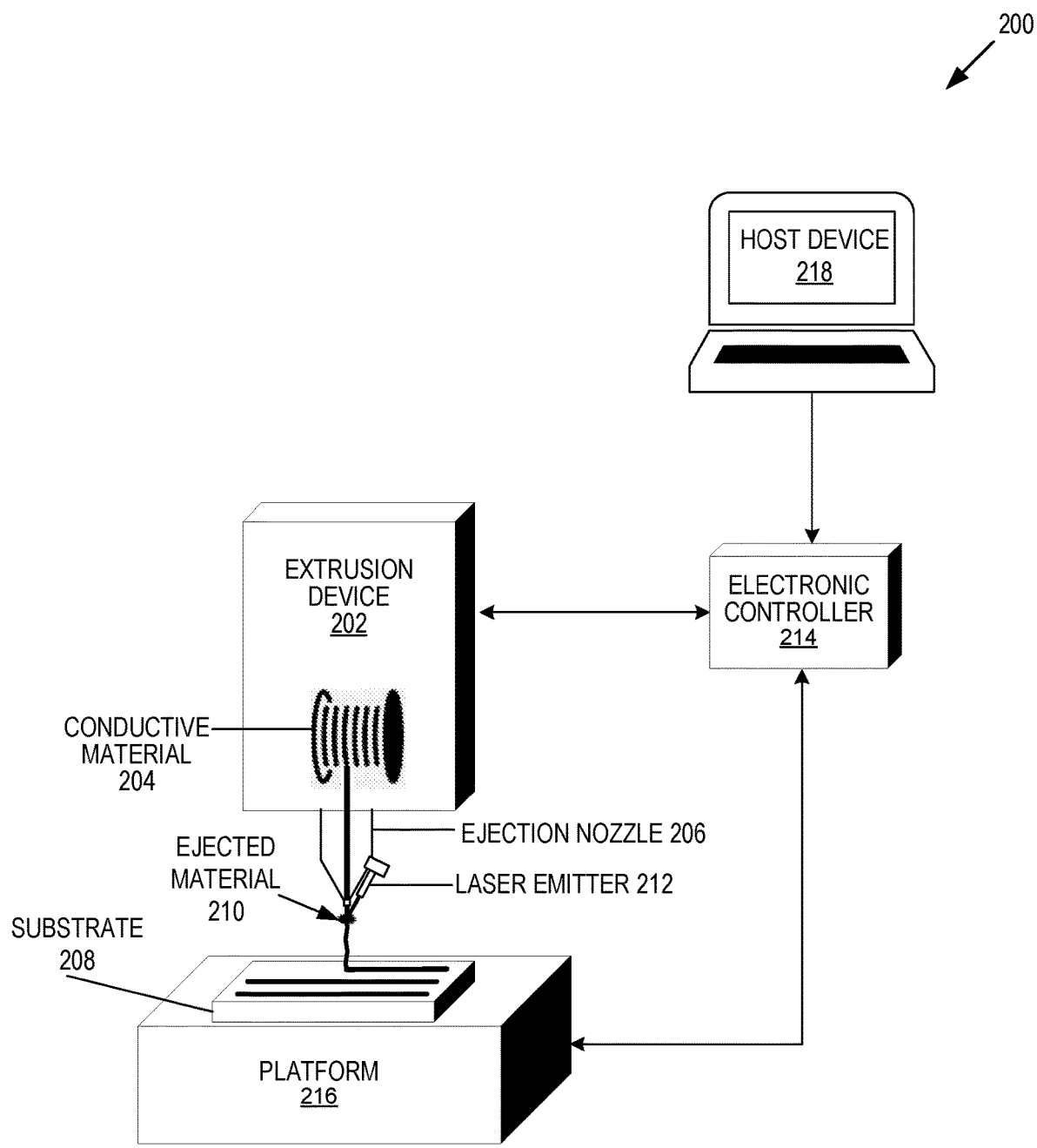
FIG. 2 is a block diagram that illustrates an additive manufacturing (AM) system for producing a network of conductive pathways on a substrate.

FIG. 2 is a block diagram that illustrates an AM system 200 operable to create a network of conductive pathways on a substrate. The system 200 includes an extrusion device 202, which has a supply of conductive material 204 that is fed through an ejection nozzle 206 to a substrate 208. As shown, a spool of a solid conductive material (e.g., conductive material 204) such as a metal wire is fed to the ejection nozzle 206, which ejects the conductive material towards the substrate 208. The ejected material 210 is heated by a laser emitter 212 to sufficiently soften the ejected material 210 such that a network of conductive pathways can be drawn on the substrate 208. Unlike conventional wire-feed AM equipment where laser light strikes the ejected material at or near the surface of a substrate, the laser emitter 212 causes laser light to strike the ejected material 210 at a distance further away from the substrate 208 to avoid damaging the substrate 208. The process deposits the softened ejected material 210 on the substrate 208 to form the network of conductive pathways (once cooled and hardened).

The AM system 200 also includes an electronic controller 214 that includes one or more processors for processing instructions that control operations of the extrusion device 202 and a platform 216 that holds the substrate 208. The extrusion device 202 can include a mechanical drive mechanism (not shown) to move the ejection nozzle 206 over the platform 216, under the direction of the electronic controller 214. Accordingly, the ejection nozzle 206 is maneuverable relative to the platform 216 for deposition of the ejected material 210 on the substrate 208. In some instances, the platform 216 is coupled to a mechanical mechanism (not shown) to maneuver the platform 216 relative to the ejection nozzle 206, to produce the network of conductive pathways on the substrate 208. In some embodiments, the mechanical mechanism is controlled programmatically or algorithmically in accordance with instructions executed by the electronic controller 214.

The electronic controller 214 receives computer instructions including print data (e.g., a 3D model) from a host device 218. The electronic controller 214 processes the print data into control information and object data. The electronic controller 214 coordinates the relative position of the ejection nozzle 206 to position the ejected material 210 over the platform 216, to create the network of conductive pathways on the substrate 208.

The AM system 200 can include other components not shown in FIG. 2 for the sake of brevity. For example, the AM system 200 can include an adjustment mechanism operable to adjust an aim of the laser emitter in a z-direction in a range including a surface of the platform and the target location. The AM system 200 can also include a mechanism operable to apply sealant to the substrate such that the network of conductive pathways is disposed in channels between a sealant layer and the substrate.

Figure 3:
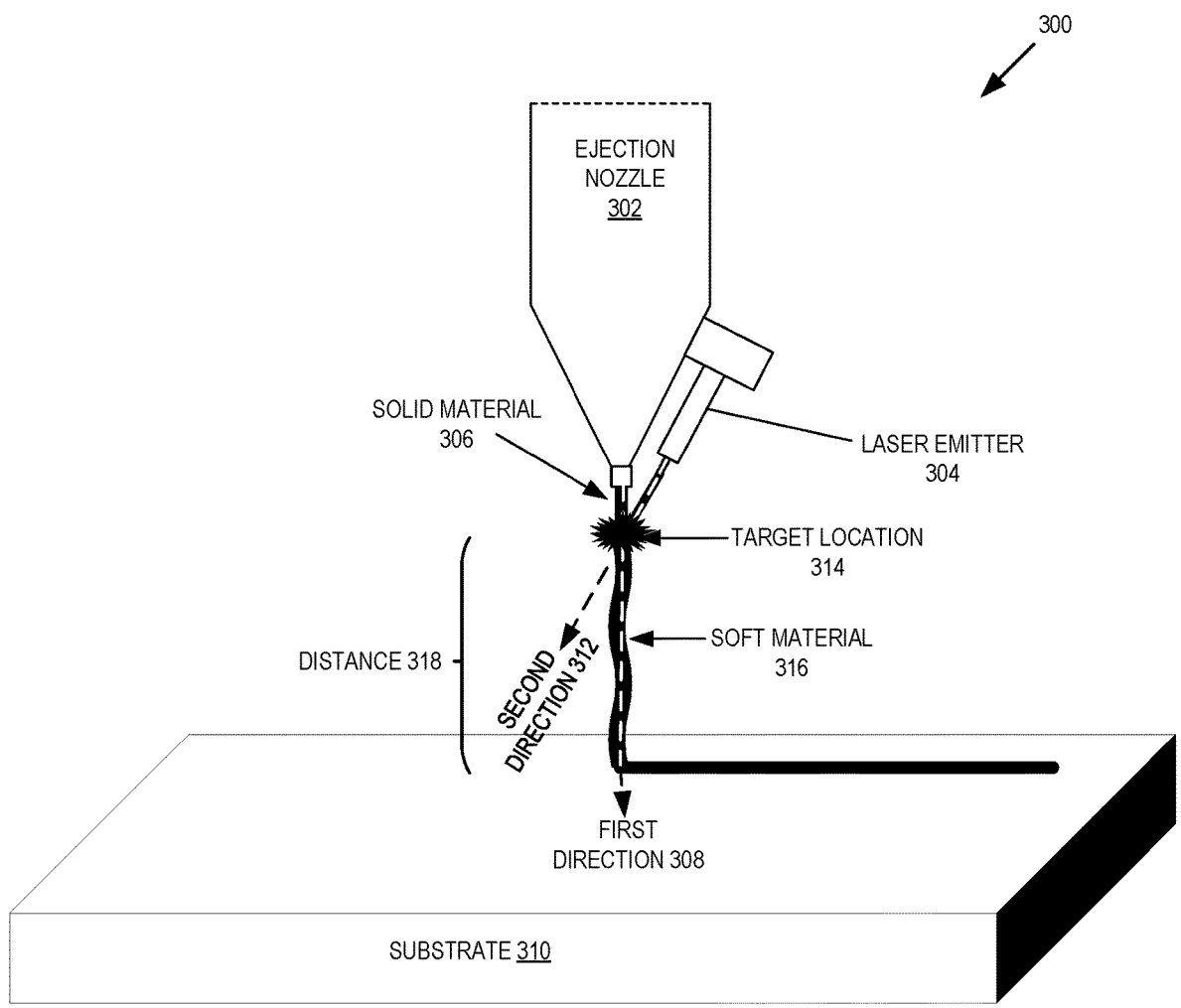
FIG. 3 is a block diagram that illustrates a deposition of conductive material on a substrate by using components of an AM device.

FIG. 3 is a block diagram that illustrates a deposition of conductive material on a substrate by using components of an AM device 300. The components of the AM device 300 include an ejection nozzle 302 that ejects conductive material and a laser emitter 304 that emits a laser light that heats the conductive material. Specifically, the ejection nozzle 302 ejects solid material 306 along a first path 308 toward the substrate 310. For example, the substrate 310 can include a polymer substrate for an automobile to fabricate an automobile connectivity panel that can function like and/or replace at least a portion of a wire harness.

The laser emitter 304 emits laser light along a second path 312 that intersects the first path 308. The second path 312 intersects the first path 308 at a target location 314, which is sufficiently distant from the platform to heat the conductive material without heating the substrate 310. The temperature of the solid material 306 is increased to produce a soft material 316 which can then be deposited as an electrical pathway on the substrate 310. The ejection nozzle 302 and/or platform can move at least along a horizontal plane parallel to the surface of the platform, to automatically draw the network of pathways with the soft material 316 on the substrate 310 in accordance with a computer model of the connectivity panel.

For example, the connectivity panel can be drawn with the AM device 300 according to an AMF. Various parameters of this AM device 300 can be optimized to form a connectivity panel with desired properties. The conductive material can be any suitable metal or alloy. Examples of suitable conductive materials for conductive filaments include, but are not limited to, metals such as copper and its alloys, aluminum and its alloys, stainless steel and other ferrous metals, titanium and its alloys, or combinations thereof.

In some embodiments, the distance 318 between the surface of the substrate 310 and the target location 314 can range from a few micrometers (μm) up to a few centimeters (cm). For example, the distance 318 can range between 10 μm and 5 cm. A preferred range may be between 100 μm (0.1 mm) and 1 cm (10 mm). The distance 318 may be a function of the properties of the conductive material and/or the substrate. For example, aluminum is more lightweight and has a lower melting point compared to copper, which is more conductive compared to aluminum. Hence, the distance may be greater for drawing a network of copper pathways compared to the distance for drawing a network of aluminum pathways. The type of laser emitter or laser light could be selected to account for the different properties of different types of conductive materials or substrates.

Examples of substrates include flexible, semi-flexible, or rigid ceramics or polymers. Examples of polymer substrates include, but are not limited to, polypropylene (PP), polycarbonate (PC), polyvinyl chloride (PVC), polybutylene terephthalate (PBT), polyethylene terephthalate (PET), polyethylene (PE), polymethyl methacrylate (PMMA), polyurethanes, polyimides, or combinations thereof. These example polymers could have different intrinsic properties such as melting point temperatures. As such, the distance from the location where the laser strikes the conductive material relative to the surface of a polymer substrate, and therefore the temperature of the conductive material itself, should be adjusted accordingly.

The disclosure is not limited to substrates made of these types of polymers. Instead, a suitable polymer substrate should have physical properties to function as a substitute for a conventional wire harness. For example, a polymer substrate could be sufficiently thin (e.g., paper-thin) and flexible to bend and conform to the shape of structures on which a conventional wire harness could be installed. Further, the polymer substrate should function as an electric insulator to insulate conductive materials deposited thereon.

In another example, the polymer substrate is rigid and contoured to form an automobile panel such as a dashboard, center console, or door panel with embedded conductive pathways. Hence, the disclosure is not limited to flexible polymer substrates. The polymer substrate could be physically shaped (e.g., molded) to tightly fit components of an automobile. Further, a network of conductive pathways can be printed on a variety of electrically insulating materials that have higher melting point temperatures compared to polymers. In such embodiments, a network of channels for the corresponding network of conductive pathways may not form according to the processes described herein. Instead, conductive material of conductive pathways can be secured to a substrate by over-molding or by applying an adhesive to the surface of a substrate and/or the conductive material.

The melting point temperatures ("melting points") of the different types of substrates can vary. To compensate for variable thermodynamic properties, the distance between a surface of a substrate and a target location of the laser (e.g., distance 318) should be selected to avoid damaging the substrate due to excess heat by the conductive material contacting the polymer substrate. The AM device may include other components known to persons skilled in the art, which could improve the fabrication process, but are not shown herein for brevity. For example, an AM platform can be temperature-controlled to cool the polymer substrate and further prevent undesired melting caused by the heated conductive material.

Figure 4A:
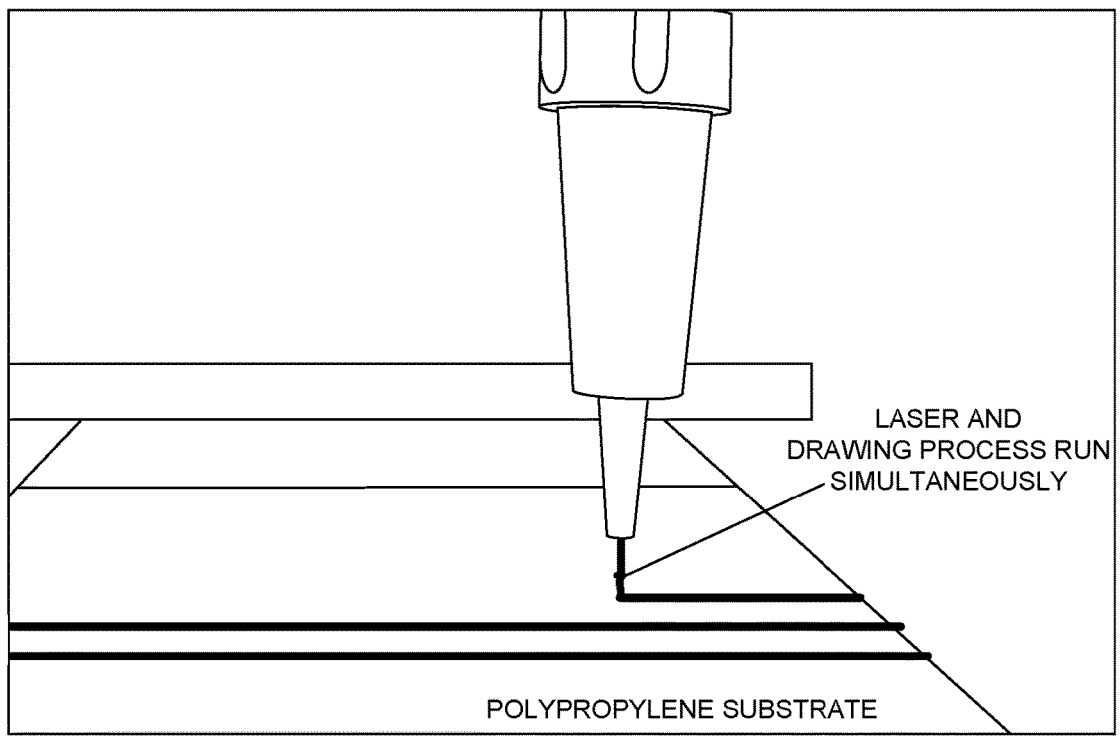
FIG. 4A illustrates an example of a deposition process of a conductive material on a polymer substrate.
Figure 4B:
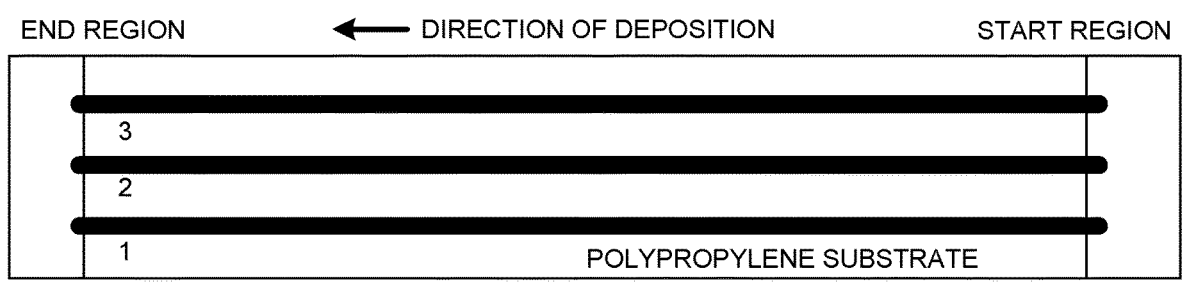
FIG. 4B shows three conductive pathways on the polymer substrate of FIG. 4A.

FIG. 4A shows an example of a deposition process of a conductive material on a polymer substrate. As shown, a pilot laser and process laser run simultaneously. The laser light that heats the conductive material strikes the conductive material at a selected distance from the polypropylene substrate. This avoids inadvertently damaging the polypropylene substrate by heating it with laser light but still allows for softening the conductive material to draw conductive pathways without damaging the polypropylene substrate. FIG. 4B shows the resulting deposition of three conductive pathways on the polypropylene substrate of FIG. 4A. As shown, the network of conductive pathways is formed on top of the substrate. The direction of the deposition is from a right start region to a left end region.

The specific example illustrated in FIGS. 4A and 4B uses a conductive material of pure aluminum wire (99.7% purity), with a 1 mm diameter, deposited on a polypropylene substrate. The distance between the surface of the polypropylene substrate and the target location on the aluminum wire is about 2 mm. The illustrated example does not show a sealant layer; however, any UV-curable or thermally-curable polymer that is liquid at room temperature would be appropriate for sealing the resulting structure shown in FIG. 4B.

Figure 5:
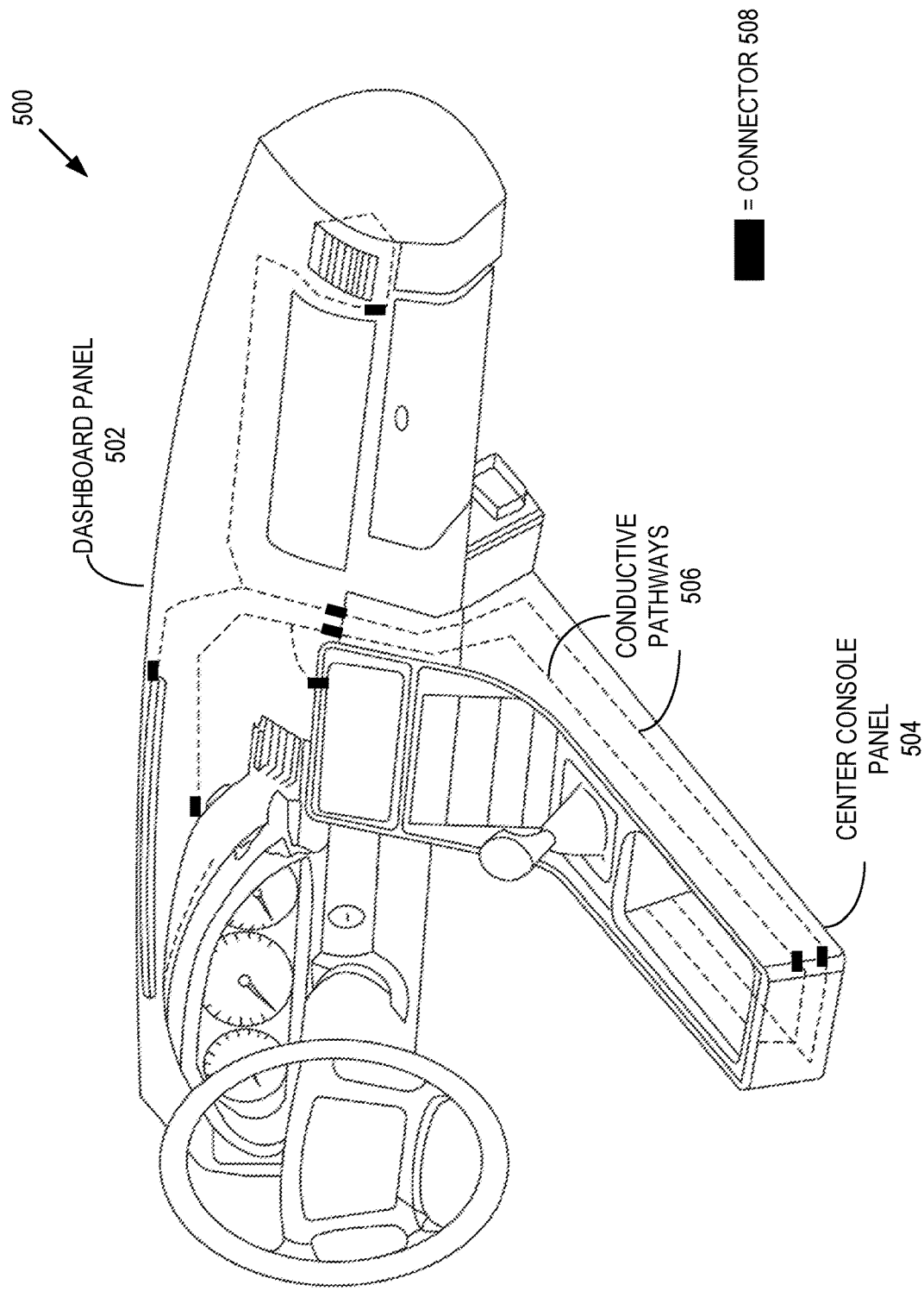
FIG. 5 depicts an example of a network of conductive pathways embedded in panels of an automobile.

FIG. 5 depicts an example of a network of conductive pathways embedded in panels of an automobile. As shown, a panel structure 500 includes a combination of panels such as a dashboard panel 502 and a center console panel 504. The dashboard panel 502 is under a windshield and contains compartments and electronic instruments. The center console panel 504 is between the driver's seat and front passenger's seat, and contains compartments and automobile electronic devices.

The panel structure 500 embeds conductive pathways 506 in the dashboard panel 502 and the console panel 504. The ends of the conductive pathways for each of the dashboard panel 502 and center console panel 504 have connectors 508 to electrically couple the portions of the conductive pathways 506 from the dashboard panel 502 and the center console panel 504 thereby forming a network of conductive pathways that are routed throughout the panel structure 500. The ends of the conductive pathways 506 that can connect to electronic components also include connectors 508 (e.g., fittings) to electrically couple the electronic components to the conductive pathways. As such, at least some portions of a conventional wire harness are unnecessary because the conductive pathways can be utilized instead.

Although illustrated as conductive pathways embedded in automobile panels, the disclosed embodiments could encompass other arrangements and structures to replace at least portions of conventional wire harnesses. For example, the conductive pathways can be disposed on a flexible polymer substrate that can fit under an automobile panel. That is, the flexible polymer substrate can physically conform to the contours of an automobile (e.g., the frame) underneath a panel. In some embodiments, a panel with embedded conductive pathways can connect to a conventional wire harness. In another example, a connectivity panel is a bus bar panel to interconnect electronic systems of the automobile. As such, the disclosed embodiments can include conductive pathways embedded in only some panels where a conventional wire harness may be unsuitable or undesired.

Examples of the automotive electronics includes an engine management system, a telematics system, an entertainment system, or the like. In some embodiments, the conductors are embedded in automobile panels and sealed from an exterior environment. The diameters of the conductors can vary for different functions. For example, a network of conductive pathways can include a first conductor for transferring power to a first automotive electronic device and a second conductor for communicating data to a second automotive electronic device. The first conductor can have a first diameter and the second conductor can have a second diameter smaller than the first diameter. Moreover, the connectable ends of an automobile panel can include fittings that are coupled to the ends of conductive pathways. The fittings can connect to complementary fittings on electronic components.

Figure 6:
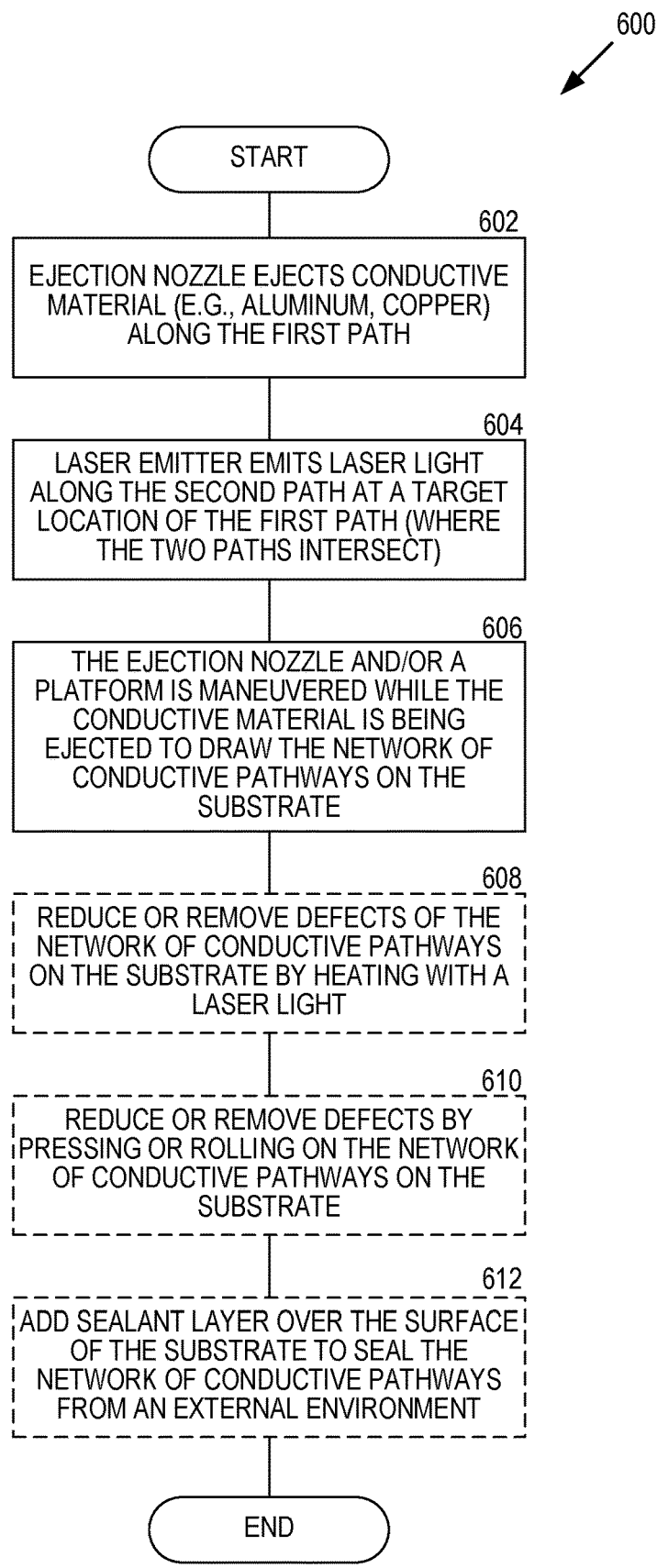
FIG. 6 is a flowchart that illustrates a process for fabricating a connectivity panel including a network of conductive pathways on a substrate.

FIG. 6 is a flowchart that illustrates a process 600 for fabricating a connectivity panel including a network of conductive pathways disposed on a substrate. In step 602, the ejection nozzle ejects conductive material (e.g., aluminum, copper) along the first path traversing from the ejection nozzle to a substrate (e.g., polypropylene, polycarbonate). The conductive material is ejected from the ejection nozzle in a semi-rigid state. For example, the ejection nozzle may eject a metal wire coiled in a spindle. In another example, the ejection nozzle is an extrusion nozzle that extrudes a metal wire from a bulk stock of metal.

In step 604, the laser emitter emits laser light along the second path at a target location of the first path (where the two paths intersect). The conductive material is heated by the laser light at the target location, which causes the conductive material to physically soften. The target location is a selected distance on the second path from the substrate. The distance is selected such that the laser light does not strike the substrate, which avoids damage such as vaporizing or tearing the substrate due to excessive heating.

The selected distance simultaneously allows the conductive material to cool (and harden) before contacting the surface of the substrate. This avoids damage to the substrate caused by the heat of the conductive material. In some embodiments, the heated conductive material causes cavities to form as channels on the substrate. As such, the conductive pathways are disposed in the channels of the substrate. In some embodiments, the heated conductive material physically and/or chemically bonds to the surface (e.g., channels) of the substrate once hardened.

In step 606, the ejection nozzle and/or a platform is maneuvered while the conductive material is being ejected to draw the network of conductive pathways on the substrate. For example, the platform or ejection nozzle could be supported by a combination of gears and hydraulic components that are operated by an electronic controller to maneuver the platform or ejection nozzle in a horizontal direction to enable drawing the network of conductive pathways in accordance with a design defined by the computer model.

In step 608, the network of conductive pathways on the substrate is optionally heated by a laser to reduce or remove defects (e.g., air bubbles) that formed due to the deposition process. In other words, a laser light traces the network of conductive pathways to smoothen the conductive pathways by removing any defects of imperfections. The energy of the laser light in this smoothing step is less than the energy of the laser light used to soften the conductive material to avoid damaging the substrate.

Figure 9:
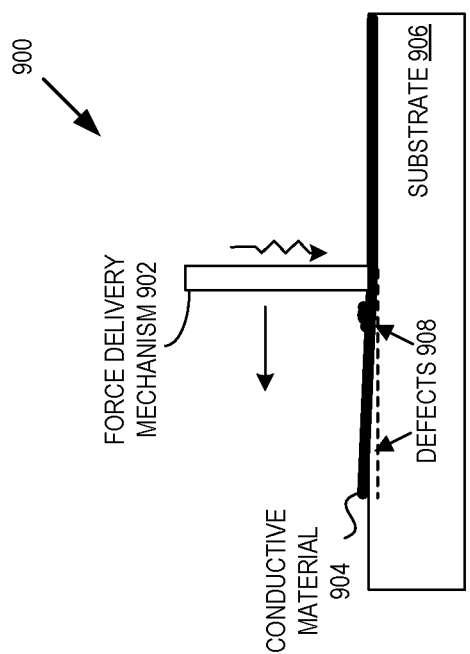
FIG. 9 is a block diagram that illustrates a technique for mechanically pressing on conductive pathways with a force delivery mechanism.

In step 610, the network of conductive pathways on the substrate is optionally mechanically pressed to reduce or remove defects that formed due to the deposition process. For example, FIG. 9 is a block diagram 900 that illustrates a technique for mechanically pressing on conductive pathways with a force delivery mechanism 902. As shown, softened conductive material 904 is disposed on a substrate 906. The conductive material 904 has defects 908 including air bubbles or being slightly displaced from the substrate 906. The force delivery mechanism 902 (e.g., hammering device) can press or strike the conductive material 904, which can smoothen the conductive material 904 and remove defects.

Figure 10:
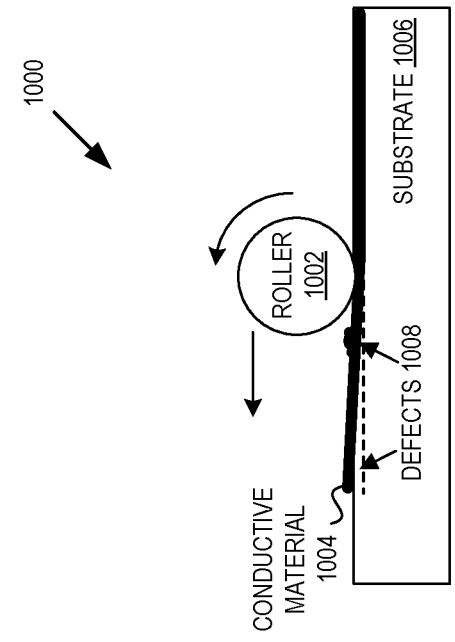
FIG. 10 is a block diagram that illustrates a technique for mechanically rolling conductive pathways with a roller.

FIG. 10 is a block diagram 1000 that illustrates a technique for mechanically rolling conductive pathways with a roller 1002. As shown, softened conductive material 1004 is disposed on a substrate 1006. The conductive material 1004 has defects 1008 including air bubbles or being slightly displaced from the substrate 1006. A roller 1002 presses over the conductive material 1004 to remove any defects and smoothen the conductive material 1004. In some examples, the techniques described in steps 608 and 610 are alternative processes whereby only one of the processes is performed to remove defects or smoothen the network of conductive pathways. However, any combination of steps 608 and 610 can be performed in any order to remove defects and/or smoothen the network of conductive pathways.

In step 612, an optional sealant layer is added over the surface of the substrate to seal the network of conductive pathways of the connectivity panel. For example, a sealant material is poured or sprayed over the surface of the substrate to form a layer that covers the network of conductive pathways. The sealant can be treated with a light or other curing means to harden the sealant and form the sealant layer.

In some embodiments, a suitable sealant material is liquid at room temperature such that it could be readily spread over the substrate and the network of conductive pathways prior to curing. Examples of suitable sealants include, but are not limited to, UV curable resins such as acrylated epoxies, acrylated polyesters, acrylated urethanes, and acrylated silicones; thermally curable (thermoset) resins such as polyesters, polyurethanes, epoxies, polycyanurates, and vinyl esters.

The resulting structure has the network of conductive pathways drawn on the substrate, which may be paper-thin and/or flexible (e.g., bendable) or rigid. The connective conductive pathways have conductive ends that are connectable to disparate electronic components to thereby form electrical circuits via the connectivity panel. In some embodiments, the conductive panel has fittings coupled to the conductive ends to connect to the electronic components. For example, an automobile connectivity panel can replace at least a portion of a conventional wire harness to connect automotive electronic devices.

The deposition of heated conductive material can cause the substrate to deform into a cavity (e.g., channel) where the conductive material is deposited. In some instances, the conductive material can bond to a surface of its channel. Once solidified, the conductive pathway is at least partially contained in the channel formed on the substrate and/or adheres to the surface of the substrate. As such, the conductive pathway is physically confined to the location on the substrate where the conductive material was placed. The placement of each conductive pathway in separate, confined channels electrically isolates the conductive pathways from each other to enable forming electrical circuits. Further, the connectivity panel can remain flexible to conform to the structure (e.g., automobile body) in which the connectivity panel is installed while mitigating the risk that conductive pathways will be displaced from their intended locations.

In some embodiments, the temperature of the heated conductive material at the point it contacts the surface of the substrate must be within a range such that, upon contacting with the substrate, a functional cavity is formed by partially vaporizing or melting the substrate. That is, the temperature of the heated conductive material should be lower than an upper threshold such that exceeding the upper threshold would cause the conductive material to melt through and tear the substrate. Thus, the temperature of the heated conductive material should be sufficient to enable deposition of the conductive material on the substrate while causing the substrate to form a functional cavity.

For example, a temperature that is sufficient to soften the conductive material and enable deposition on the substrate may be insufficient to deform the substrate to form a suitable channel. As a result, the conductive material would be disposed on the surface of the substrate and would be readily displaced due to any movement of the substrate. Accordingly, a lower threshold temperature of the softened conductive material should be sufficiently higher than the melting point of the substrate to form the desired channel for the conductive material. Therefore, causing the molten conductive material to contact the substrate at a temperature within the lower and upper thresholds results in a connectivity panel that may be paper-thin, lightweight, and durable.

FIGS. 7A through 7D illustrate cutaway side-views of different conductive structures (e.g., conductive) disposed on a substrate, which illustrate how the structure of a resulting connectivity panel can vary depending on a combination of factors including the melting points of conductive materials and substrates. In the illustrated examples, the conductive structures are shaped as conductive wires ("conductors") on substrates.

Figure 7A:
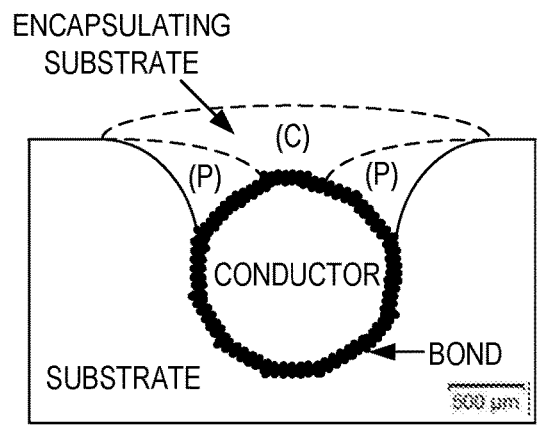
FIG. 7A illustrates a cutaway side view of an example of at least partially encapsulated conductor disposed in a cavity of a substrate.

FIG. 7A illustrates a cutaway side view of an example of a conductor disposed in a cavity of a substrate. As shown, the conductor is disposed entirely below the original surface of the substrate (before being deformed by the heat from the conductor). In other words, the substrate deforms to partially (P) or completely (C) surround the conductor. At least a portion of the surface of the conductor bonds directly to at least a portion of the surface of the cavity formed on the substrate. The bonding between the conductor and substrate improves physical adherence of the conductor to the desired location on the substrate.

Figure 7B:
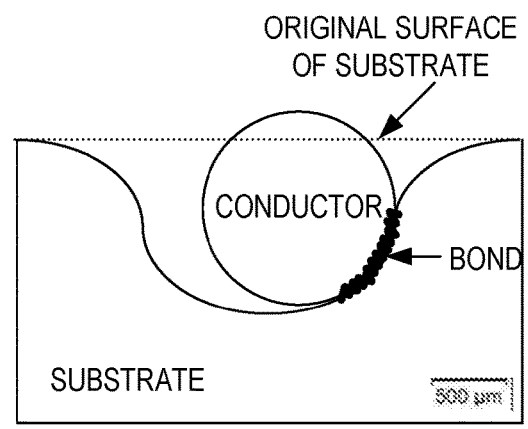
FIG. 7B illustrates a cutaway side view of another example of a conductor disposed on a cavity of a substrate.

FIG. 7B illustrates a cutaway side view of another example of a conductor disposed in a cavity that forms part of a channel in a substrate. As shown, the conductor is disposed partially below the original surface of the substrate (before being deformed by the heat from the conductor). In other words, the substrate deforms to cradle the conductor, which still protrudes above the surface of the surface. Like FIG. 7A, at least a portion of the surface of the conductor bonds to a portion of the surface of the cavity formed on the substrate. However, a lesser portion of the conductor in FIG. 7B is bonded to the substrate compared to the conductor of FIG. 7A. Nevertheless, the bonding between the conductor and substrate mitigates the risk of displacing the conductor that results because of partially protruding from the substrate.

Figure 7C:
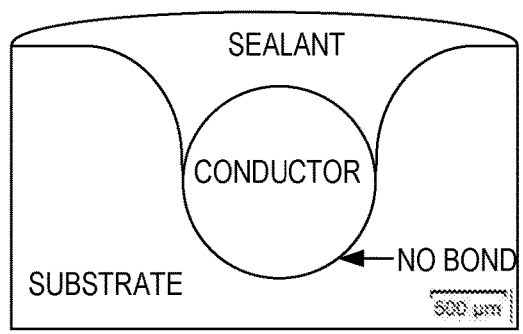
FIG. 7C illustrates a cutaway side view of an example of a conductor disposed in a cavity of a substrate and sealed from an external environment.

FIG. 7C illustrates a cutaway side view of an example of a conductor disposed in a cavity of a substrate and contained in the cavity by a sealant layer that electrically and physically insulates the conductor. As such, the conductor is embedded in the cavity of a substrate and sealed from an external environment by the sealant layer. The conductor of FIG. 7C is not bonded to any portion of the cavity formed in the substrate. However, the conductor is securely contained in place due to the sealant layer.

Figure 7D:
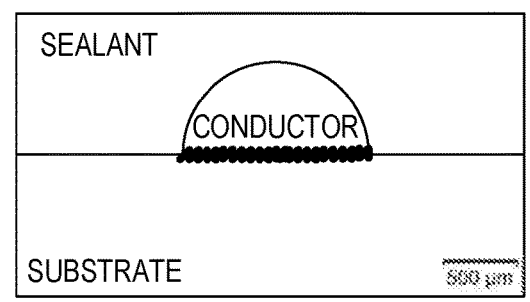
FIG. 7D illustrates a cutaway side view of an example of a conductor disposed on the surface of a substrate and sealed from an external environment.

FIG. 7D illustrates a cutaway side view of an example of a conductor disposed on the surface of a substrate and sealed from an external environment. The conductor is deposited on top of the substrate and sealed from an external environment by the sealant layer. The conductor of FIG. 7D is optionally bonded to the substrate. However, the conductor can be securely contained in place without bonding due to the sealant layer.

The configurations of the conductors, substrates, and/or sealants are not limited to the arrangements shown in FIGS. 7A through 7D. Further, a person skilled in the art would understand other materials that could be used to obtain the desired effects described herein. For example, the conductive material or polymer substrate could be coated with an adhesive that activates to bond the conductor to the substrate when being deposited by the AM equipment.

A person skilled in the art would understand other possible configurations based on this disclosure. For example, a conductor can be disposed partially below the original surface of a substrate similar to the arrangement of FIG. 7B. Unlike FIGS. 7A, the conductor is not necessarily bonded to any portion of the cavity formed in the polymer substrate. As such, the conductor could freely move relative to the substrate.

Figure 8:
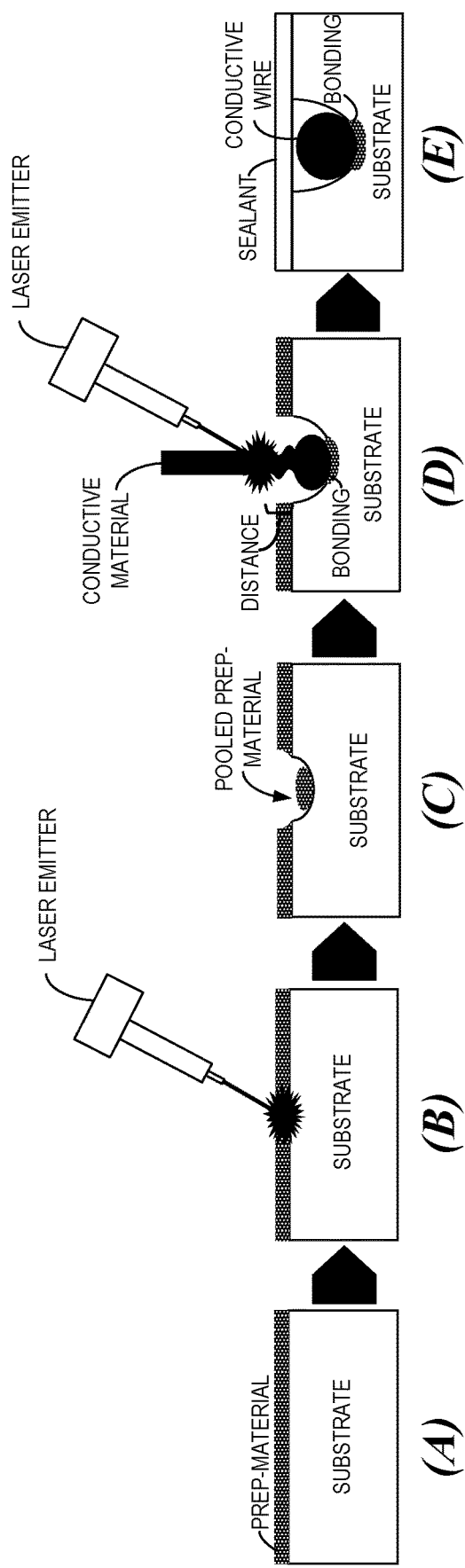
FIG. 8 is a block diagram that illustrates a process for depositing a conductive material including preprocessing of a preparatory material layered on a substrate.

FIG. 8 is a block diagram that illustrates a process for depositing a conductive material including preprocessing of a preparatory material ("prep-material") initially layered on a substrate. The prep-material can facilitate controlling the precision with which a conductive wire is embedded in a substrate. In (A), the prep-material is layered on the substrate. The prep-material can be a thin sheet, powder, or nodules that are placed or distributed over the substrate. As such, the prep-material forms an initial layer on the substrate. The prep-material can be conductive or non-conductive but offer a different range of melting points compared to the conductive material that forms the network of conductive pathways.

The prep-material can have a variety of properties to pre-etch channels by lasering or chemically reacting with the prep-material. For example, the prep-material can be a polymer or metal powder that melts when heated with a laser light as shown in (B).The laser heats the prep-material to a temperature causing the substrate to form a channel where at least some of the molten prep-material pools as shown in (C). The channel formed by the prep-material can receive conductive material softened by a laser light at a distance from the surface of the substrate as shown in (D) and similarly described with respect to FIG. 2. Hence, the pre-etched channels can form an outline for the AM deposition process described with respect to FIG. 2.

The melting point of the prep-material is different from the melting point of the conductive material, which are each different from the melting point of the substrate. For example, the melting point of the prep-material can be between the melting points of the substrate and the conductive material. The gradient of melting points facilitates forming a conductive pathway in the substrate with a suitable depth without tearing through the substrate. For example, the melting point of the conductive material may be such that heating with a laser near the surface of the substrate could damage through the substrate. By using the prep-material to pre-process the substrate, the conductive material can be heated closer to the surface of the substrate (compared to the example described in FIG. 2) because, among other things, the prep-material can absorb the heat transferred to the substrate thereby reducing the risk that the substrate gets damages. At the same time, the molten prep-material can create a bonding agent between the substrate and the conductive wire that forms in the channel. The prep-material that remains on the surface of the substrate can be removed and replaced with a sealant as shown in (E) to seal the conductive wire in the substrate from an external environment.

In some embodiments, a pre-etched outline is a pattern of grooves formed by a mechanical etching process. In particular, a substrate is mechanically pre-etched or pre-machined with grooves into which the conductive material is deposited in accordance with the AM process described with respect to FIG. 2. In one example, an AM device is programmed to draw a network of conductive pathways by tracing the pre-etched pattern of machined grooves. An example of a mechanical etching process includes a computer numerical control (CNC) machining process in which pre-programmed computer software dictates the movement of machinery (e.g., grinders, mills, routers). Likewise, the AM device is programmed to draw the network of conductive pathways by tracing the pre-etched pattern of machined grooves.

Figure 11:
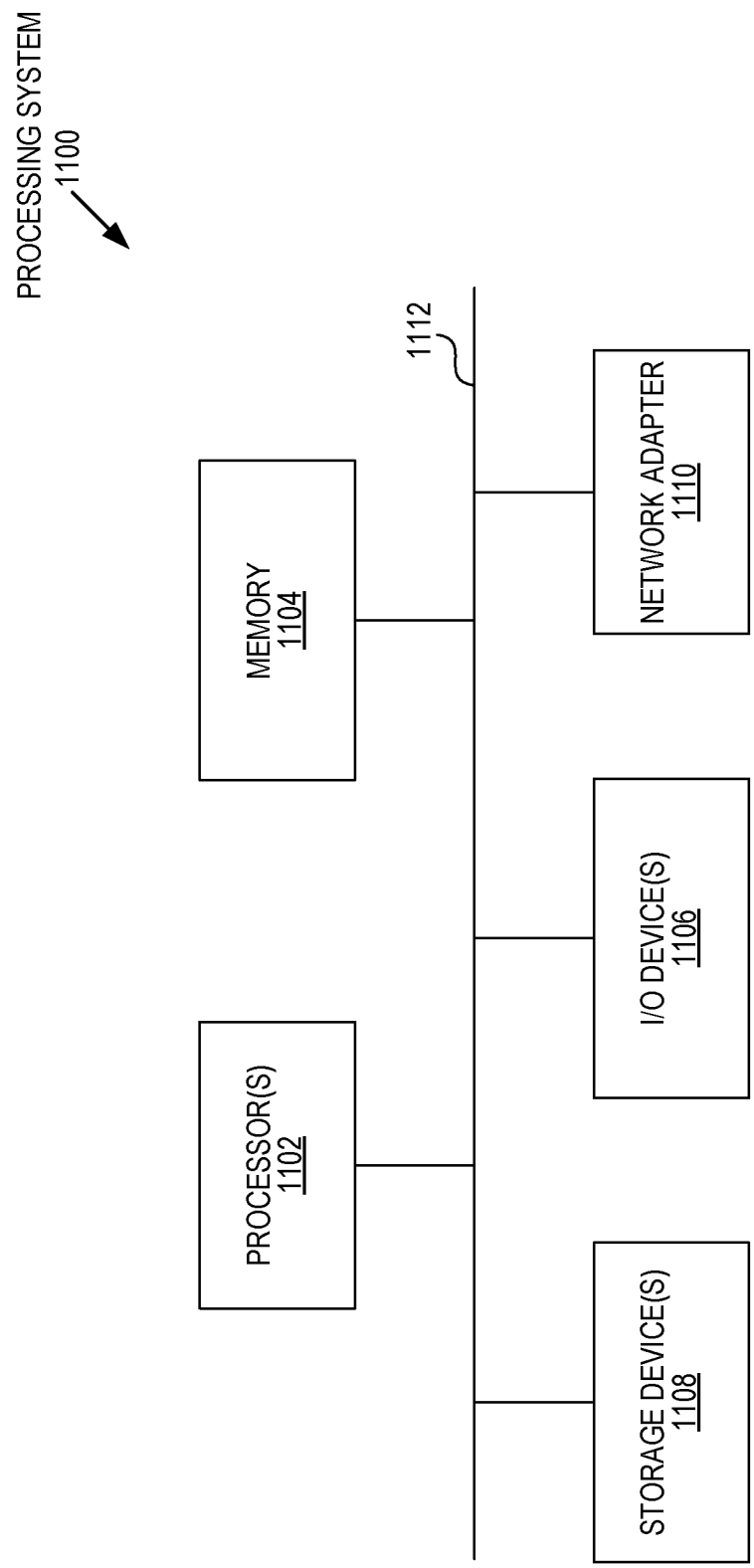
FIG. 11 is a block diagram of a computer system operable to implement aspects of the disclosed technology.

FIG. 11 is a block diagram of a processing system 1100 that is operable to implement aspects of the disclosed technology. The processing system 1100 may be a server computer, a client computer, a tablet computer, a laptop computer, a handheld mobile device (e.g., smartphone), an appliance, a network device, or any machine capable of executing a set of instructions (sequential or otherwise) that specifies actions to be taken by that machine. In the disclosed embodiments, examples of the processing system 1100 include components of the system shown in FIG. 2 including the electronic controller or host device.

The processing system 1100 may include one or more central processing units ("processors") 1102, memory 1104, input/output devices 1106 (e.g., keyboard and pointing devices, touch devices, display devices), storage devices 1108 (e.g., disk drives), and network adapter 1110 (e.g., network interfaces) that are connected to an interconnect 1112. The interconnect 1112 is illustrated as an abstraction that represents any one or more separate physical buses, point-to-point connections, or both that are connected by appropriate bridges, adapters, or controllers. Therefore, the interconnect 1112 may include, for example, a system bus, a peripheral component interconnect (PCI) bus or PCI-Express (PCI-E) bus, a HyperTransport or industry standard architecture (ISA) bus, a small computer system interface (SCSI) bus, a universal serial bus (USB), inter-integrated circuit (12C) bus, or an Institute of Electrical and Electronics Engineers (IEEE) standard 1394 bus, also called "Firewire."

The memory 1104 and storage devices 1108 are computer-readable storage media that may store instructions that implement at least portions of the various embodiments. In addition, the data structures and message structures may be stored or transmitted via a data transmission medium (e.g., a signal on a communications link). Various communications links may be used (e.g., the Internet, a local area network, a wide area network, or a point-to-point connection). Thus, computer-readable media can include computer-readable storage media (e.g., "non-transitory" media) and computer-readable transmission media.

The instructions stored in memory 1104 can be implemented as software and/or firmware to program the processor(s) 1102 to carry out actions described above. In some embodiments, such software or firmware may be initially provided to the processor(s) 1102 by downloading it from a remote system through the processing system 1100 (e.g., via network adapter 1110).

The various embodiments introduced herein can be implemented by, for example, programmable circuitry (e.g., one or more microprocessors) programmed with software and/or firmware, or entirely in special-purpose hardwired (non-programmable) circuitry, or in a combination of such forms. Special-purpose hardwired circuitry may be in the form of, for example, one or more ASICs, PLDs, FPGAs, etc.

A software program, when referred to as "implemented in a computer-readable storage medium," includes computer-readable instructions stored in memory (e.g., memory 1104). A processor (e.g., processor(s) 1102) is "configured to execute a software program" when at least one value associated with the software program is stored in a register that is readable by the processor. In some embodiments, routines executed to implement the disclosed embodiments may be implemented as part of the operating system (OS) software (e.g., MICROSOFT WINDOWS®, LINUX®) or a specific software application, component, program, object, module, or sequence of instructions, referred to as "computer programs."

As such, the computer programs typically comprise one or more instructions set at various times in various memory devices of a computer (e.g., processing system 1100) and which, when read and executed by a at least one processor (e.g., processors 1102), cause the computer to perform operations to execute features involving the various aspects of the disclosure embodiments. In some embodiments, a carrier containing the aforementioned computer program product is provided. The carrier is one of an electronic signal, an optical signal, a radio signal, or a non-transitory computer-readable storage medium (e.g., the memory 1104).

Operation of a memory device (e.g., memory 1104), such as a change in state from a binary one to a binary zero (or vice-versa) may comprise a visually perceptible physical transformation. The transformation may comprise a physical transformation of an article to a different state or thing. For example, a change in state may involve accumulation and storage of charge or release of stored charge. Likewise, a change of state may comprise a physical change or transformation in magnetic orientation or a physical change or transformation in molecular structure, such as from crystalline to amorphous or vice versa.

Aspects of the disclosed embodiments may be described in terms of algorithms and symbolic representations of operations on data bits stored on memory. These algorithmic descriptions and symbolic representations generally include a sequence of operations leading to a desired result. The operations require physical manipulations of physical quantities. Usually, though not necessarily, these quantities take the form of electrical or magnetic signals capable of being stored, transferred, combined, compared, and otherwise manipulated. Customarily and for convenience, these signals are referred to as bits, values, elements, symbols, characters, terms, numbers, or the like. These and similar terms are associated with physical quantities and are merely convenient labels that are applied to these quantities.

The above description and drawings are illustrative and are not to be construed as limiting. Numerous specific details are described to provide a thorough understanding of the disclosure. However, in certain instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not all necessarily referring to the same embodiment, nor are separate or alternative embodiments mutually exclusive of other embodiments. Moreover, various features are described, which may be exhibited by some embodiments and not by others. Similarly, various requirements are described, which may be requirements for some embodiments but not for other embodiments.

The terms used in this description generally have ordinary meanings in the art, within the context of the disclosure, and in the specific context where each term is used. Certain terms that are used to describe the disclosure are discussed above, or elsewhere in the description, to provide additional guidance to the practitioner regarding the description of the disclosure. It will be appreciated that the same thing can be said in more than one way. For example, one will recognize that "memory" is one form of a "storage" and that the terms may, on occasion, be used interchangeably.

Consequently, alternative language and synonyms may be used for any one or more of the terms discussed herein, and no special significance is to be placed upon whether or not a term is elaborated or discussed herein. Synonyms for certain terms are provided. A recital of one or more synonyms does not exclude the use of other synonyms. The use of examples anywhere in this description, including examples of any term discussed herein, are illustrative only and are not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given above. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

From the foregoing, it will be appreciated that specific embodiments of the invention have been described herein for purposes of illustration, but that various modifications may be made without deviating from the scope of the invention. Accordingly, the invention is not limited except as by the appended claims.

The invention claimed is:

1. An automobile panel comprising:
a molded polymer substrate that forms a surface of the automobile panel;
a network of additively manufactured conductive pathways including electrically conductive material integrated in a plurality of cavities forming a network of channels on the surface of the automobile panel, wherein the electrically conductive material is at least partially encapsulated on the surface of the automobile panel; and
a plurality of connectors coupled to ends of the network of additively manufactured conductive pathways, wherein the plurality of connectors are connectable to a plurality of automotive electronic devices thereby forming a plurality of electrical circuits that include the network of additively manufactured conductive pathways and the plurality of automotive electronics.

2. The automobile panel of claim 1, further comprising:
a sealant layer on an underside of the automobile panel, wherein the network of additively manufactured conductive pathways are disposed between the molded polymer substrate and the sealant layer.

3. The automobile panel of claim 1, wherein the plurality of automotive electronic devices include an engine management system, a telematics system, or an entertainment system.

4. The automobile panel of claim 1, wherein the network of additively manufactured conductive pathways includes a first conductor for transferring power to a first automotive electronic device and a second conductor for communicating data to a second automotive electronic device, the first conductor having a first diameter and the second conductor having a second diameter smaller than the first diameter.

5. The automobile panel of claim 1, wherein the automobile panel is contoured as a dashboard panel, a center console panel, a door panel, or a combination thereof.

6. The automobile panel of claim 1, wherein the automobile panel is a bus bar panel to interconnect a plurality of electronic systems of the automobile.

7. A connectivity panel comprising:
a molded substrate composed of an electrically insulating material that forms a surface of the connectivity panel;
an additively manufactured electrically conductive pathway including electrically conductive material integrated in a cavity on the surface of the connectivity panel,
wherein the cavity is formed on a surface of the molded substrate as a channel that at least partially encapsulates the electrically conductive material on the surface of the connectivity panel; and
a connectable end for the additively manufactured electrically conductive pathway,
wherein the connectable end is configured to connect the additively manufactured electrically conductive pathway to an electronic component thereby forming an electrical circuit that includes the additively manufactured electrically conductive pathway and the electronic component.

8. The connectivity panel of claim 7, wherein the channel only partially encapsulates the electrically conductive material, the connectively panel further comprising:
a sealant layer disposed over the molded substrate, the additively manufactured electrically conductive pathway being disposed between the molded substrate and the sealant layer to encapsulate the electrically conductive material.

9. The connectivity panel of claim 8, wherein the sealant layer comprises a UV curable resin, a thermally curable resin, or a combination thereof.

10. The connectivity panel of claim 7, further comprising:
a network of additively manufactured electrically conductive pathways including electrically conductive material deposited in a network of channels on the molded substrate; and
a plurality of connectable ends for the network of additively manufactured electrically conductive pathways.

11. The connectivity panel of claim 7, further comprising:
a fitting coupled to the connectable end, the fitting being configured to connect to a complementary fitting of the electronic component.

12. The connectivity panel of claim 7, wherein the molded substrate is a flexible substrate.

13. The connectivity panel of claim 7, wherein the molded substrate is a rigid substrate.

14. The connectivity panel of claim 7, wherein the molded substrate comprises polypropylene (PP), polycarbonate (PC), polyvinyl chloride (PVC), polybutylene terephthalate (PBT), polyethylene terephthalate (PET), polyethylene (PE), polymethyl methacrylate (PMMA), polyurethanes, polyimides, or any combination thereof.

15. The connectivity panel of claim 7, wherein the electrically conductive material comprises aluminum, copper, stainless steel, or any combination thereof.

16. The connectivity panel of claim 7, wherein the electrically conductive material is bonded directly to the channel of the molded substrate.

17. The connectivity panel of claim 7, further comprising:
a bonding agent disposed between the electrically conductive material of the additively manufactured electrically conductive pathway and the channel of the molded substrate, the bonding agent forming a bond between the electrically conductive material and the channel of the molded substrate.

18. The connectivity panel of claim 7, wherein only a portion of the additively manufactured electrically conductive pathway is bonded to the channel of the substrate.

19. The connectivity panel of claim 7, wherein the electrically conductive material has a first melting point temperature and the molded substrate has a second melting point temperature, the second melting point temperature being lower than the first melting point temperature.

20. The connectivity panel of claim 7, wherein a bonding agent bonds the electrically conductive material to the channel of the molded substrate, the electrically conductive material has a first melting point temperature, the bonding agent has a second melting point temperature, and the molded substrate has a third melting point temperature, the second melting point temperature being lower than the first melting point temperature and the third melting point temperature being lower than the second melting point temperature.

21. The connectivity panel of claim 7, wherein the channel is formed based on thermal conduction of the electrically conductive material to the molded substrate.

22. The connectivity panel of claim 7, wherein the connectable end for the additively manufactured electrically conductive pathway is a first connectable end and the electronic component is a first electronic component, the connectivity panel further comprising:
a second connectable end for the additively manufactured electrically conductive pathway, the second connectable end being configured to connect the additively manufactured electrically conductive pathway to a second electronic component thereby forming the electrical circuit that include the additively manufactured electrically conductive pathway, the first electronic component, and the second electronic component.

23. The automobile panel of claim 1, wherein the electrically conductive material comprises:
a laser deposition wire,
wherein the laser deposition wire has a laser deposition temperature equal to or greater than a decomposition temperature of the molded polymer substrate.

24. The automobile panel of claim 1, wherein the electrically conductive material comprises:
a wire that is configured for laser deposition.

25. The automobile panel of claim 1, wherein the molded polymer substrate has a decomposition temperature equal to or less than a laser melting point temperature of the electrically conductive material.

\* \* \* \* \*